(12) United States Patent
Litton et al.

(10) Patent No.: US 7,662,489 B2
(45) Date of Patent: Feb. 16, 2010

(54) DURABLE REACTIVE THERMAL BARRIER COATINGS

(75) Inventors: David A. Litton, Rocky Hill, CT (US); Kevin W. Schlichting, Storrs, CT (US); Melvin Freling, West Hartford, CT (US); John G. Smeggil, Simsbury, CT (US); David B. Snow, Glastonbury, CT (US); Michael J. Maloney, Marlborough, CT (US)

(73) Assignee: United Technologies Corporation, Hartford, CT (US)

( * ) Notice: Subject to any disclaimer, the term of this patent is extended or adjusted under 35 U.S.C. 154(b) by 553 days.

(21) Appl. No.: 11/336,437

(22) Filed: Jan. 20, 2006

(65) Prior Publication Data

US 2008/0138658 A1 Jun. 12, 2008

(51) Int. Cl.
  *B32B 9/00* (2006.01)
(52) U.S. Cl. .................. 428/701; 428/472; 428/469; 428/697; 428/699; 428/702
(58) Field of Classification Search .............. None
  See application file for complete search history.

(56) References Cited

U.S. PATENT DOCUMENTS

| 6,177,200 | B1 | 1/2001 | Maloney |
| 6,261,643 | B1 | 7/2001 | Hasz et al. |
| 6,284,323 | B1 | 9/2001 | Maloney |
| 6,835,465 | B2 | 12/2004 | Allen et al. |
| 6,875,529 | B1 * | 4/2005 | Spitsberg et al. ............ 428/701 |
| 2002/0028344 | A1 | 3/2002 | Beele |
| 2003/0008764 | A1 * | 1/2003 | Wang et al. ................. 501/152 |

FOREIGN PATENT DOCUMENTS

| CN | 1253878 A | 5/2000 |
| EP | 0825271 | 2/1998 |

OTHER PUBLICATIONS

Chinese Office Action dated Mar. 27, 2009.

* cited by examiner

*Primary Examiner*—Ling Xu
(74) *Attorney, Agent, or Firm*—Bachman & LaPointe, P.C.

(57) ABSTRACT

A turbine engine component is provided which has a substrate and a thermal barrier coating applied over the substrate. The thermal barrier coating comprises at least one layer of a first material selected from the group consisting of a zirconate, a hafnate, a titanate, and mixtures thereof, which first material has been mixed with, and contains, from about 25 to 99 wt % of at least one oxide. The at least one oxide comprises at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium. If desired, a metallic bond coat may be present between the substrate and the thermal barrier coating system. A method for forming the thermal barrier coating system of the present invention is described.

20 Claims, 1 Drawing Sheet

DURABLE REACTIVE THERMAL BARRIER COATINGS

BACKGROUND OF THE INVENTION (1) Field of the Invention

The present invention relates to a thermal barrier coating materials that react with deposits on the thermal barrier coatings during service in a turbine engine to form a nearly impermeable barrier phase at or near the interface between the thermal barrier coating and the deposits, to a method for forming a thermal barrier coating, and to a turbine engine component having the thermal barrier coating.

(2) Prior Art

The degradation of turbine airfoils due to sand related distress of thermal barrier coatings is a significant concern with all turbine engines used in a desert environment. This type of distress can cause engines to be taken out of operation for significant repairs.

Sand related distress is caused by the penetration of fluid sand deposits into the thermal barrier coatings which leads to spallation and accelerated oxidation of any exposed metal.

SUMMARY OF THE INVENTION

In accordance with the present invention, there is provided a thermal barrier coating system which reduces sand related distress on turbine engine components. The thermal barrier coating system broadly comprises a material selected from the group consisting of a zirconate, a hafnate, a titanate, and mixtures thereof, which material has been mixed such that it contains about 25-99 wt % of at least one oxide.

Further in accordance with the present invention, a turbine engine component is provided which broadly comprises a substrate and a thermal barrier coating comprising a material selected from the group consisting of a zirconate, a hafnate, a titanate, and mixtures thereof, which material has been doped with from about 20-100 wt % of at least one oxide.

Still further in accordance with the present invention, a method for forming a coating system which reduces sand related distress is provided. The method broadly comprises the steps of providing a substrate, depositing a material selected from the group consisting of a zirconate, a hafnate, a titanate, and mixtures thereof, which material has been doped with from about 20-100 wt % of at least one oxide onto the substrate.

Other details of the durable reactive thermal barrier coatings of the present invention, as well as other objects and advantages attendant thereto, are set forth in the following detailed description and the accompanying drawing wherein like reference numerals depict like elements.

DETAILED DESCRIPTION OF THE PREFERRED EMBODIMENT(S)

It has been discovered that certain coatings react with fluid sand deposits and a reaction product forms that inhibits fluid sand penetration into the coating. The reaction product has been identified as being a silicate oxyapatite/garnet containing primarily gadolinia, calcia, zirconia, and silica. The present invention relates to a coating system for a component, such as a turbine engine component, which takes advantage of this discovery.

Figure 1:
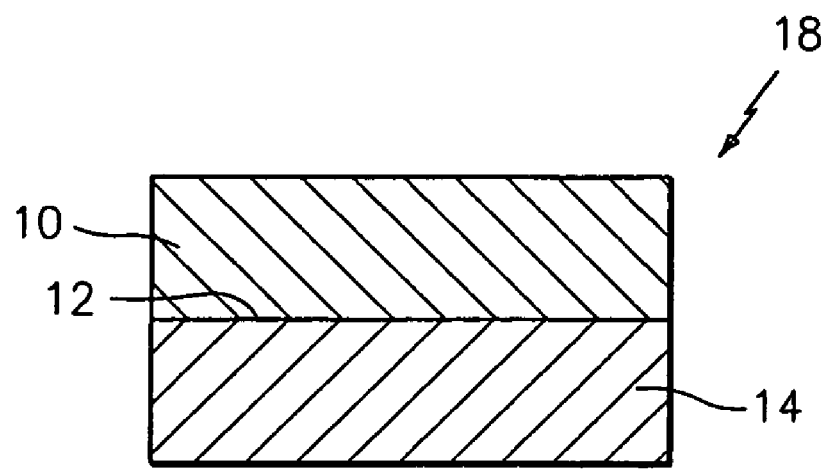
FIG. 1 is a schematic representation of a turbine engine component with the coating of the present invention.

In accordance with the present invention, referring now to FIG. 1, the coating system 18 of the present invention includes at least one layer of a material selected from the group consisting of a zirconate, a hafnate, a titanate, and mixtures thereof, which material has been doped with from about 25-100 wt % of at least one oxide. In order to form the coating system 18, at least one layer 10 of a material selected from the group consisting of a zirconate, a hafnate, a titanate, and mixtures thereof, is applied to a surface 12 of a substrate 14, such as a turbine engine component including, but not limited to, a blade or a vane. Materials which can be used to form each layer 10 include, but are not limited to, gadolinium zirconate, lanthanum zirconate, neodymium titanate, and gadolinium hafnate. The material in each layer 10 is mixed with, and preferably contains, from about 25 to 99 wt %, preferably from about 40-70 wt %, of at least one oxide of a metal selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium. For example, the at least one oxide could be a sesquioxide of one of the aforementioned rare earth elements.

The substrate 14 may be formed from any suitable material such as a nickel based superalloy, a cobalt based alloy, a moldybdenum based alloy, or a titanium based alloy.

Each layer 10 may be applied by, for example, electron beam physical vapor deposition (EB-PVD) or air plasma spray. Other methods which can be used to deposit each layer 10 includes, but is not limited to, sol-gel techniques, slurry techniques, sputtering techniques, chemical vapor deposition techniques, HVOF, and UV curable resin techniques.

A preferred process for performing the deposition of each layer 10 is EB-PVD. When performing this process, the substrate 14 may be placed in a coating chamber and heated to a temperature in the range of from 1700 to 2000 degrees Fahrenheit. The coating chamber may be maintained at a pressure in the range of from 0.05 to 2.0 millitorrs. The feedstock feed rate may be from 0.3 to 2.0 inches/hour. The coating time may be in the range of from 20 to 120 minutes.

Each deposited layer 10 may have a thickness of from about 1.0 to 50 mils, preferably from about 1.0 to 15 mils.

The layer(s) 10 of the thermal barrier coating material in accordance with the present invention will react with molten sand deposits and form a barrier phase of oxyapatite and/or garnet to resist further penetration.

The coating system of the present invention is an advantageous thermal barrier coating system that resists the penetration of molten silicate material. The coating system provides enhanced durability in environments where sand induced distress of turbine airfoils occurs.

Figure 2:
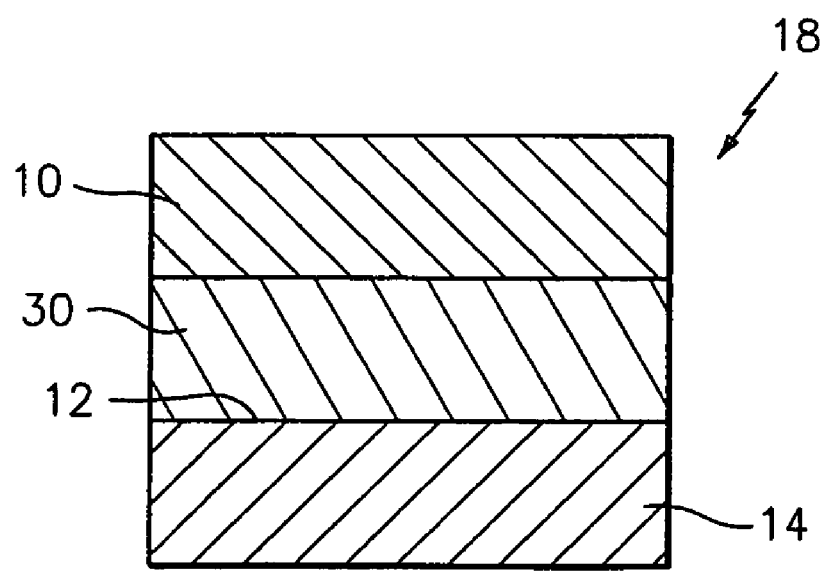
FIG. 2 is a schematic representation of a turbine engine component with an alternative coating system in accordance with the present invention.

Referring now to FIG. 2, if desired, a metallic bond coat 30 may be deposited onto the substrate 14 to bond the substrate 14 to the layer 10. The metallic bond coat 30 may be a MCrAlY bond coat where M is at least one of nickel, cobalt, and iron. Alternatively, the metallic bond coat 30 may be an aluminide or platinum aluminide bond coat. The bond coat 30 may have a thickness in the range of from about 0.5 to 20 mils, preferably from about 0.5 to 10 mils. The bond coat 30 may be deposited by a low pressure plasma spray, HVOF (high velocity oxygen fuel), a cathodic arc process, a diffusion process, an air plasma spray process, or a plating process, as well as by any process which is capable of forming a dense uniform metallic structure.

It is apparent that there has been provided in accordance with the present invention a durable reactive thermal barrier coating which fully satisfies the objects, means, and advantages set forth hereinbefore. While the present invention has been described in the context of specific embodiments, other unforeseeable alternatives, modifications, and variations may become apparent to those skilled in the art having read the foregoing description. Accordingly, it is intended to embrace those alternatives, modifications, and variations which fall within the broad scope of the appended claims.

What is claimed is:

1. A turbine engine component comprising:
   a substrate; and
   a thermal barrier coating system deposited on said substrate, said thermal barrier coating system reacting with molten sand deposits to form a barrier phase of at least one of oxyapatite and garnet to resist further penetration of said sand and said thermal barrier coating system comprising at least one layer consisting of a titanate mixed with at least one oxide comprising at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium, each said layer having from about 25 to 99 wt % of said at least one oxide.

2. The turbine engine component of claim 1, wherein each said layer has from about 40 to 70 wt % of said at least one oxide.

3. The turbine engine component according to claim 1, wherein each said layer has a thickness in the range of from 1.0 to 50 mils.

4. The turbine engine component according to claim 1, wherein each said layer has a thickness in the range of from 1.0 to 15 mils.

5. The turbine engine component according to claim 1, wherein said substrate is formed from a material selected from the group consisting of a nickel based alloy, a cobalt based alloy, and a molybdenum based alloy.

6. The turbine engine component according to claim 1, further comprising a metallic bond coat between said substrate and said thermal barrier coating.

7. The turbine engine component according to claim 6, wherein said bond coat has a thickness in the range of from about 0.5 to 20 mils.

8. The turbine engine component according to claim 6, wherein said bond coat has a thickness in the range of from about 0.5 to 10 mils.

9. A turbine engine component comprising:
   a substrate; and
   a thermal barrier coating system deposited on said substrate, said thermal barrier coating system reacting with molten sand deposits to form a barrier phase of at least one of oxyapatite and garnet to resist further penetration of said sand and said thermal barrier coating system comprising at least one layer consisting of a material selected from the group consisting of gadolinium zirconate, neodymium titanate, and gadolinium hafnate mixed with at least one oxide comprising at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium, and each said layer having from about 25 to 99 wt % of said at least one oxide.

10. The turbine engine component of claim 9, wherein each said layer contains from about 40 to 70 wt % of said at least one oxide.

11. The turbine engine component according to claim 9, wherein each said layer has a thickness in the range of from 1.0 to 50 mils.

12. The turbine engine component according to claim 9, wherein each said layer has a thickness in the range of from 1.0 to 15 mils.

13. The turbine engine component according to claim 9, wherein said substrate is formed from a material selected from the group consisting of a nickel based alloy, a cobalt based alloy, and a molybdenum based alloy.

14. The turbine engine component according to claim 9, further comprising a metallic bond coat between said substrate and said thermal barrier coating.

15. The turbine engine component according to claim 14, wherein said bond coat has a thickness in the range of from about 0.5 to 20 mils.

16. The turbine engine component according to claim 14, wherein said bond coat has a thickness in the range of from about 0.5 to 10 mils.

17. A coating system for a component comprising a thermal barrier coating system which reacts with molten sand deposits to form a barrier phase of at least one of oxyapatite and garnet to resist further penetration of said sand and said thermal barrier coating system comprising at least one layer consisting of a titanate which has been mixed with at least one oxide, said at least one oxide comprising at least one oxide of a material selected from the group consisting of cerium, praseodymium, neodymium, promethium, samarium, europium, gadolinium, terbium, dysprosium, holmium, erbium, thulium, ytterbium, lutetium, scandium, indium, and yttrium, and each said layer having from about 25 to 99 wt % of said at least one oxide.

18. The coating system according to claim 17, wherein each said layer contains from about 40 wt % to 70 wt % of said at least one oxide.

19. A coating system for a component comprising a thermal barrier coating system which reacts with molten sand deposits to form a barrier phase of at least one of oxyapatite and garnet to resist further penetration of said sand and said thermal barrier coating system comprising at least one layer consisting of a first material selected from the group consisting of gadolinium zirconate, neodymium titanate, and gadolinium hafnate, and at least one oxide, said at least one oxide comprising at least one oxide of a material selected from the group consisting of lanthanum, cerium, praseodymium, neodymium, promethium, samarium, europium, gadolinium, terbium, dysprosium, holmium, erbium, thulium, ytterbium, lutetium, scandium, indium, and yttrium, and each said layer having from about 25 to 99 wt % of said at least one oxide.

20. The coating system according to claim 19, wherein each said layer contains from about 40 wt % to 70 wt % of said at least one oxide.

* * * * *

UNITED STATES PATENT AND TRADEMARK OFFICE
CERTIFICATE OF CORRECTION

PATENT NO. : 7,662,489 B2
APPLICATION NO. : 11/336437
DATED : February 16, 2010
INVENTOR(S) : Litton et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 694 days.

Signed and Sealed this

Fourth Day of January, 2011

David J. Kappos
*Director of the United States Patent and Trademark Office*